US009337784B2

(12) United States Patent
Kim et al.

(10) Patent No.: US 9,337,784 B2
(45) Date of Patent: May 10, 2016

(54) APPARATUS AND METHOD FOR MATCHING HARMONICS

(71) Applicants: Samsung Electronics Co., Ltd., Suwon-si, Gyeonggi-do (KR); Postech Academy-Industry Foundation, Pohang-si, Gyeongsangbuk-do (KR)

(72) Inventors: Il-Du Kim, Suwon-si (KR); Bumman Kim, Pohang-si (KR); Jung-Hwan Son, Pohang-si (KR); Kyoung-Tae Kim, Yongin-si (KR); Dong-Geun Lee, Hwaseong-si (KR)

(73) Assignees: Samsung Electronics Co., Ltd., Suwon-si (KR); Postech Academy—Industry Foundation, Pohang-si (KR)

( * ) Notice: Subject to any disclaimer, the term of this patent is extended or adjusted under 35 U.S.C. 154(b) by 0 days.

(21) Appl. No.: 14/323,427

(22) Filed: Jul. 3, 2014

(65) Prior Publication Data

US 2015/0008980 A1 Jan. 8, 2015

(30) Foreign Application Priority Data

Jul. 5, 2013 (KR) ........................ 10-2013-0079208

(51) Int. Cl.
*H03F 3/04* (2006.01)
*H03F 1/26* (2006.01)
*H03F 1/56* (2006.01)
*H03F 3/193* (2006.01)

(52) U.S. Cl.
CPC ................ *H03F 1/565* (2013.01); *H03F 3/193* (2013.01)

(58) Field of Classification Search
USPC .......................................... 330/302, 149, 277
IPC .................................................. H03F 3/04,1/26
See application file for complete search history.

(56) References Cited

U.S. PATENT DOCUMENTS 5,767,743 A * 6/1998 Morimoto ............ H03F 3/1935 327/184
8,076,994 B2 * 12/2011 Farrell .................... H01L 23/66 330/302
8,872,583 B2 * 10/2014 Lee ....................... H03F 1/3241 330/149
2002/0063603 A1 * 5/2002 Gotou ................... H03F 1/0205 330/302
2004/0056723 A1 * 3/2004 Gotou ................... H03F 1/0288 330/295
2008/0191801 A1 * 8/2008 Kim ...................... H03F 1/0288 330/124 R
2012/0262234 A1 * 10/2012 Lee ....................... H03F 1/3241 330/149

FOREIGN PATENT DOCUMENTS

KR 20090092059 A 8/2009
KR 20100086794 A 8/2010

* cited by examiner

*Primary Examiner* — Patricia T Nguyen
(74) *Attorney, Agent, or Firm* — Jefferson IP Law, LLP

(57) ABSTRACT

An apparatus of a power amplifier is provided. The apparatus includes an input boosting circuit configured to match a second harmonic input signal using a harmonic control circuit of an input stage to maximize an efficiency and an output power, a die cell configured to receive and amplify an output signal of the input boosting circuit, and an output boosting circuit configured to receive an output signal of the die cell and to match a second harmonic output signal of the output signal of the die cell using a harmonic control circuit of an output stage to maximize the efficiency and the output power.

20 Claims, 12 Drawing Sheets

HARMONIC CONTROL CIRCUIT

APPARATUS AND METHOD FOR MATCHING HARMONICS

CROSS-REFERENCE TO RELATED APPLICATION(S)

This application claims the benefit under 35 U.S.C. §119 (a) of a Korean patent application filed on Jul. 5, 2013 in the Korean Intellectual Property Office and assigned Serial number 10-2013-0079208, the entire disclosure of which is hereby incorporated by reference.

JOINT RESEARCH AGREEMENT

The present disclosure was made by or on behalf of the below listed parties to a joint research agreement. The joint research agreement was in effect on or before the date the present disclosure was made and the present disclosure was made as a result of activities undertaken within the scope of the joint research agreement. The parties to the joint research agreement are 1) Samsung Electronics Co., Ltd. and 2) Postech Academy—Industry Foundation.

TECHNICAL FIELD

The present disclosure relates to harmonic matching in a power amplifier.

BACKGROUND

As a wireless communication system evolves, it provides a service for delivering various contents in addition to text or voice. For doing so, it is needed to transmit much information at a time. To this end, a power amplifier should linearly amplify a modulation signal and a wideband signal of high Peak-to-Average Power Ratio (PAPR).

However, a general power amplifier operates with a low efficiency for the high PAPR signal and thus produces great heat. As a result, the power amplifier further requires a cooling system, which increases a size of a transmitter including the power amplifier and raises a manufacturing cost. Also, the transmitter may not operate stably due to the high heat. An additional device is needed to compensate for this.

As the wireless communication system evolves, demands for the power amplifier supporting multimode/multiband increase, but research thereon is insufficient. Recently, a study is conducted on the power amplifier operating in the wideband through low-Q matching Still, such a power amplifier lacks high efficiency because the high efficiency can be attained through harmonic impedance matching in addition to fundamental impedance matching.

Hence, a method and an apparatus for the harmonic impedance matching is needed.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and an apparatus for harmonic matching.

Another aspect of the present disclosure is to provide a method and an apparatus of a power amplifier including a circuit which easily matches harmonics.

Yet another aspect of the present disclosure is to provide a method and an apparatus for reducing external harmonic impedance effect using a harmonic control circuit in a power amplifier.

Still another aspect of the present disclosure is to provide a method and an apparatus for matching a second harmonic component of an input/output stage to an efficient optimization region and increasing efficiency by adding a harmonic control circuit in a power amplifier.

In accordance with an aspect of the present disclosure, an apparatus of a power amplifier is provided. The apparatus includes an input boosting circuit configured to match a second harmonic input signal using a harmonic control circuit of an input stage to maximize an efficiency and an output power, a die cell configured to receive and amplify an output signal of the input boosting circuit, and an output boosting circuit configured to receive an output signal of the die cell and to match a second harmonic output signal of the output signal of the die cell using a harmonic control circuit of an output stage to maximize the efficiency and the output power.

In accordance with another aspect of the present disclosure, a method for operating a power amplifier is provided. The method includes matching, at an input boosting circuit, a second harmonic input signal using a harmonic control circuit of an input stage to maximize efficiency and output power, receiving and amplifying, at a die cell, an output signal of the input boosting circuit, and receiving, at an output boosting circuit, an output signal of the die cell and matching a second harmonic output signal of the output signal of the die cell using a harmonic control circuit of an output stage to maximize the efficiency and the output power.

In accordance with another aspect of the present disclosure, a power amplifier of an electronic device is provided. The power amplifier includes an input boosting circuit configured to receive an input signal from a first external matching circuit of the electronic device, an output boosting circuit configured to provide an output signal to an second external matching circuit of the electronic device, and a die cell disposed between and directly connected to both the input boosting circuit and the output boosting circuit.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components and structures.

DETAILED DESCRIPTION

Figure 1:
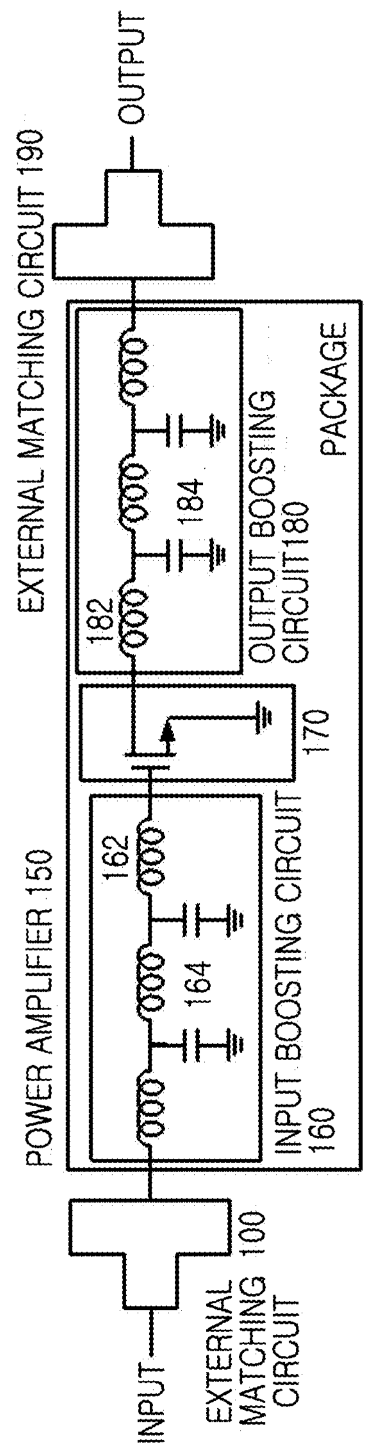
FIG. 1 illustrates a general power amplifier according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Various embodiments of the present disclosure provide a method and an apparatus for harmonic matching.

The present disclosure relates to a method for enhancing efficiency in a wide bandwidth in performance of a high-efficiency power amplifier, and more particularly, to a method and an apparatus of a power amplifier including a circuit which easily matches harmonics.

A general power amplifier employs an input/output boosting circuit therein to match a low matching impedance to 50 ohm. The boosting circuit facilitates fundamental impedance matching. In so doing, the fundamental impedance matching is feasible in the wideband using low-Q matching but lessens efficiency of the fundamental impedance matching because harmonic matching is not performed concurrently. To address this problem, the present disclosure matches a second harmonic component of an input/output stage to an efficient optimization region and enhances the efficiency by adding a harmonic control circuit in the power amplifier.

Since the harmonics are controlled in the power amplifier, it is not affected by an external matching circuit. As such, since the present disclosure performs the low-Q fundamental impedance matching in the wideband and concurrently performs the impedance matching in a high efficiency region for the harmonics regardless of a particular external matching circuit and the fundamental matching circuit, the high efficiency can be obtained in the wideband.

A high-efficiency wideband power amplifier of the present disclosure can be applied to a base station and a terminal. For the high efficiency in the wideband, the power amplifier includes an internal impedance boosting circuit and further includes a second harmonic impedance matching circuit for the wideband operation, thus facilitating the fundamental impedance matching and the second harmonic impedance matching therein.

The high-efficiency wideband power amplifier includes an input stage including an input boosting circuit, which includes a wideband harmonic control circuit, an output stage including an output boosting circuit, which includes a wideband harmonic control circuit, and a basic die cell.

The high-efficiency wideband power amplifier can be applied to high-efficiency power amplifiers for any switching and saturation, such as class D, class E, class F, class J, and saturated Power Amplification (PA).

The high-efficiency wideband power amplifier includes a second harmonic control circuit for maximizing a voltage gain and the efficiency of the second harmonic component of the input stage without being affected by an external impedance of the power amplifier, a second harmonic control circuit for maximizing an output power and the efficiency of the second harmonic component of the output stage without being affected by the external impedance of the power amplifier, and a die cell for amplification and power generation.

Hereafter, the wideband power amplifier of the present disclosure is elucidated by referring to the attached drawings.

FIG. 1 is a block diagram of a general power amplifier according to an embodiment of the present disclosure.

Referring to FIG. 1, a power amplifier 150 may be included in a base station. The power amplifier 150 uses an input boosting circuit 160 and an output boosting circuit 180 for easily matching the low-matching impedance to 50 ohm. A die cell 170 in the power amplifier 150 amplifies an input signal.

The input boosting circuit 160 and the output boosting circuit 180 generate the low matching impedance of the input/output stage to facilitate the matching. The input boosting circuit 160 and the output boosting circuit 180 include capacitors 164 and 184 for the typical boosting and inductors 162 and 182 for the boosting.

The input boosting circuit 160 and the output boosting circuit 180 facilitate the fundamental impedance matching and do not perform a specific function for the harmonic component. The boosted fundamental impedance is matched to the wideband through the low-Q matching of external matching circuits 100 and 190.

Figure 2:
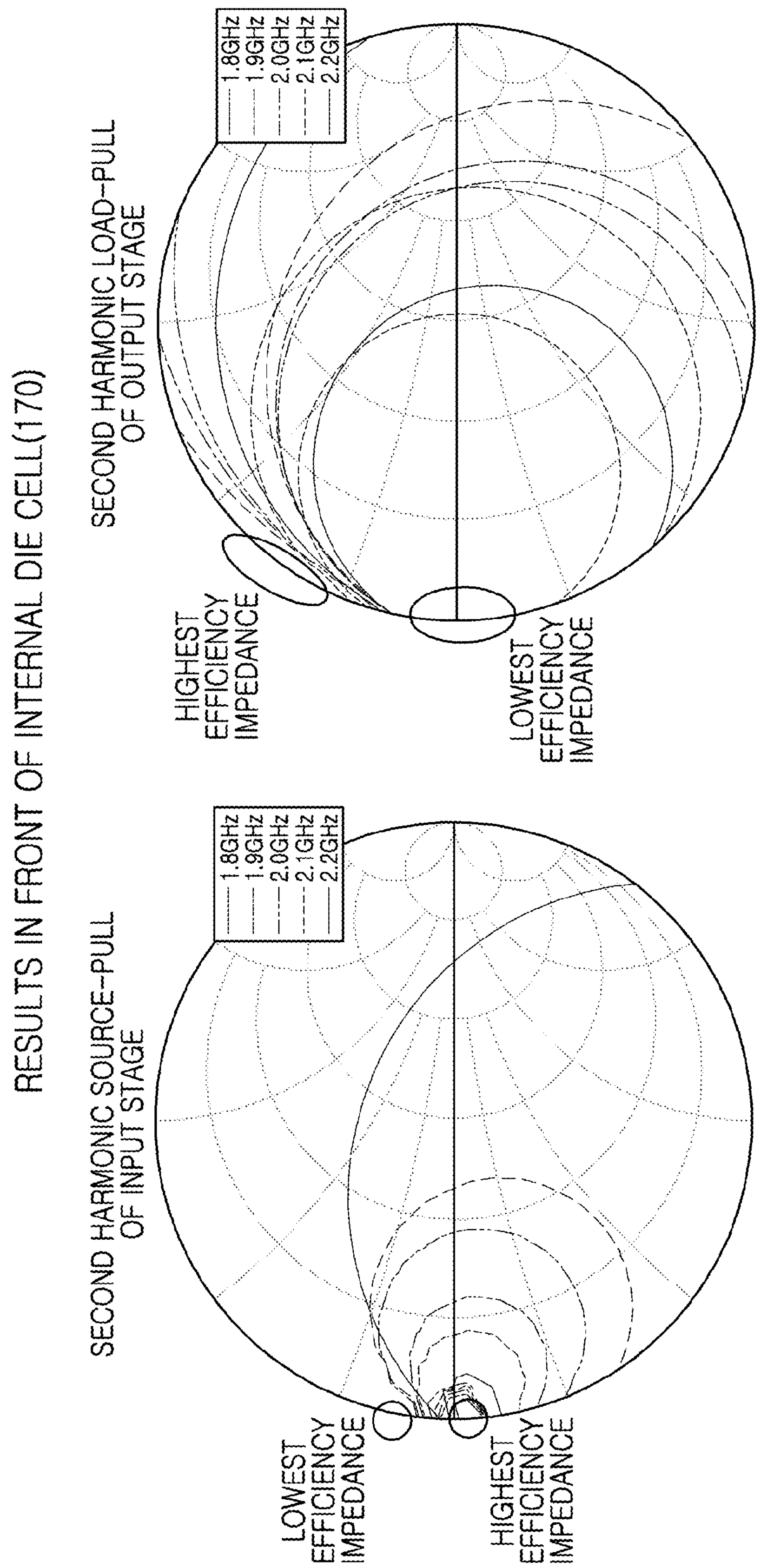
FIG. 2 illustrates second harmonic impedance source-pull and load-pull results of an input/output stage in front of a die cell in a power amplifier according to an embodiment of the present disclosure.

FIG. 2 depicts second harmonic impedance source-pull and load-pull results of an input/output stage in front of a die cell in a power amplifier according to an embodiment of the present disclosure.

Referring to FIG. 2, the efficiency of the second harmonics affects the performance of the power amplifier. Typically, the power amplifier operating in the narrow band can match the fundamental impedance, the second harmonics, and more harmonic components using the external matching circuit. However, this cannot be expanded to the wideband.

Accordingly, not affecting the fundamental impedance matching in the bandwidth is needed, while concurrently matching the second harmonic impedance. That is, it is needed to place the impedance of the second harmonic component in the maximum efficiency impedance region of Smith chart of FIG. 2 in the internal matching circuit of the power amplifier.

Figure 3:
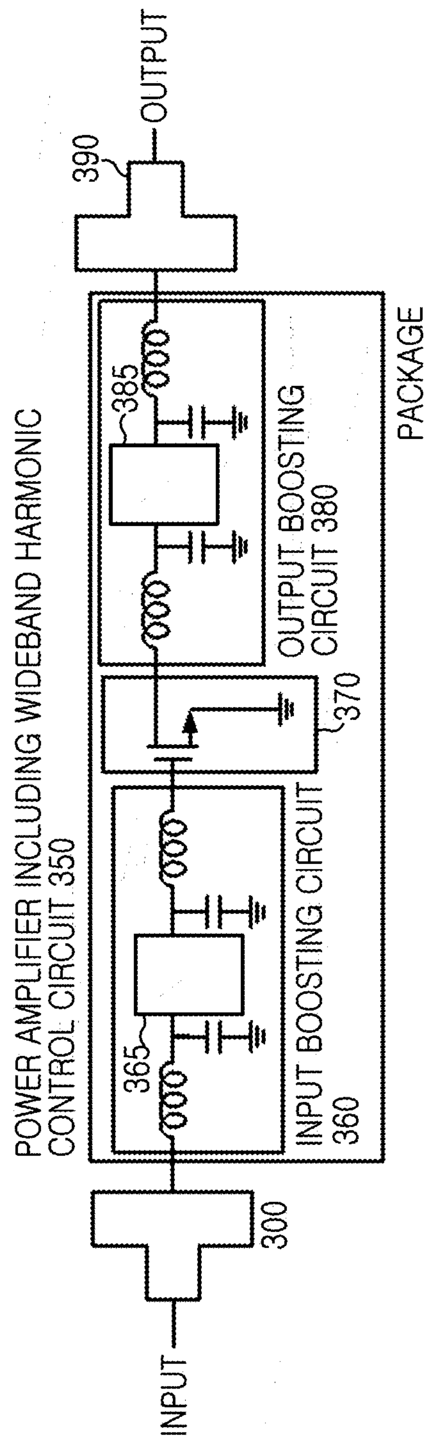
FIG. 3 illustrates a power amplifier including a harmonic control and impedance boosting circuit and a single die cell of an input/output stage according to an embodiment of the present disclosure.

FIG. 3 depicts a power amplifier including a harmonic control and impedance boosting circuit and a single die cell of an input/output stage according to an embodiment of the present disclosure.

Referring to FIG. 3, a power amplifier 350 includes an input boosting circuit 360 for always matching a second harmonic input signal to a short region of the maximum efficiency and output power in front of a die cell 370 using a harmonic control circuit 365 of the input stage.

The power amplifier 350 includes an output boosting circuit 380 for always matching the second harmonic input signal to an inductive region of the maximum efficiency and output power behind the die cell 370 using a harmonic control circuit 385 of the output stage.

The boosted fundamental impedance is matched to the wideband through the low-Q matching of external matching circuits 300 and 390.

Figure 4:
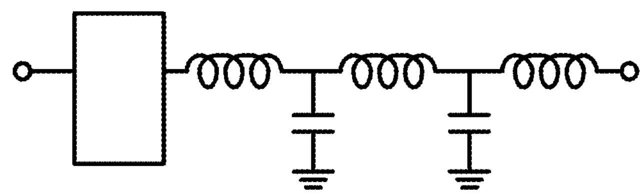
FIG. 4 illustrates a control circuit in a power amplifier according to embodiment of the present disclosure.

FIG. 4 depicts a harmonic control circuit in a power amplifier according to an embodiment of the present disclosure.

Referring to FIG. 4, the harmonic control circuit controls the harmonics at a first stage in an internal matching circuit of the power amplifier.

Figure 5:
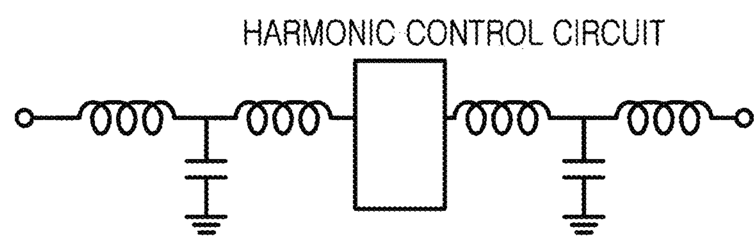
FIG. 5 illustrates a harmonic control circuit in a power amplifier according to another embodiment of the present disclosure.

FIG. 5 depicts a harmonic control circuit in a power amplifier according to another embodiment of the present disclosure.

Referring to FIG. 5, the harmonic control circuit controls the harmonics at a mid stage in the internal matching circuit of the power amplifier.

Figure 6:
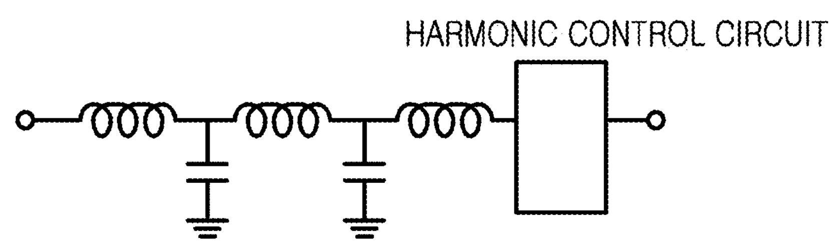
FIG. 6 illustrates a harmonic control circuit in a power amplifier according to yet another embodiment of the present disclosure.

FIG. 6 depicts a harmonic control circuit in a power amplifier according to an embodiment of the present disclosure.

Referring to FIG. 6, the harmonic control circuit controls the harmonics at a last stage in the internal matching circuit of the power amplifier.

Referring to FIGS. 4, 5, and 6, an optimization point of the harmonic control circuit varies according to a transistor type, the output power, and a parasitic component of the power amplifier.

Figures 7A, 7B:
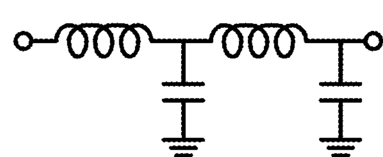
FIGS. 7A and 7B illustrate the harmonic control circuit in a power amplifier according to an embodiment of the present disclosure.

FIGS. 7A and 7B depict a harmonic control circuit of a power amplifier according to an embodiment of the present disclosure.

Referring to FIGS. 7A and 7B, the harmonic control circuit in the power amplifier can employ a serial combination of an inductor and a capacitor, as shown in FIG. 7A, or a parallel combination of an inductor and a capacitor, as shown in FIG. 7B, and include various combinations according to the optimization point.

Figure 8A:
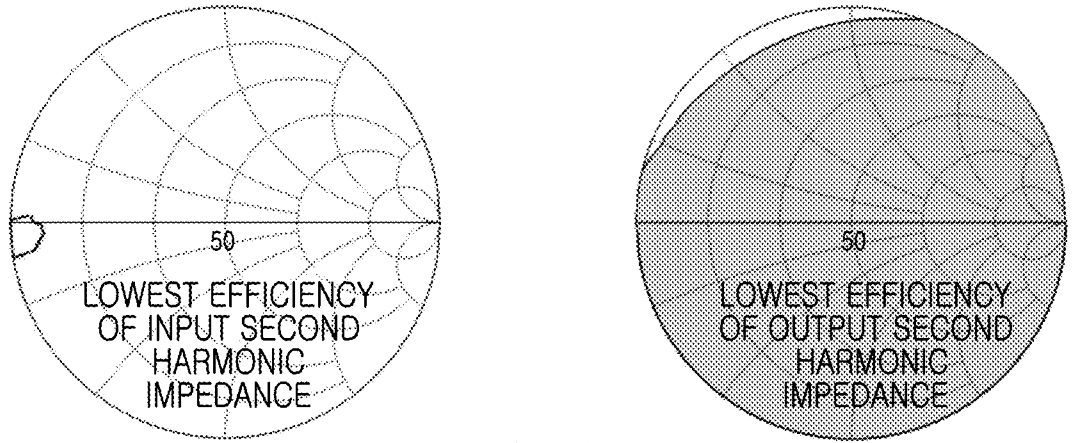
FIGS. 8A and 8B illustrate source-pull and load-pull results of second harmonic component efficiency distribution of an input/output stage outside a power amplifier according to an embodiment of the present disclosure.
Figure 8B:
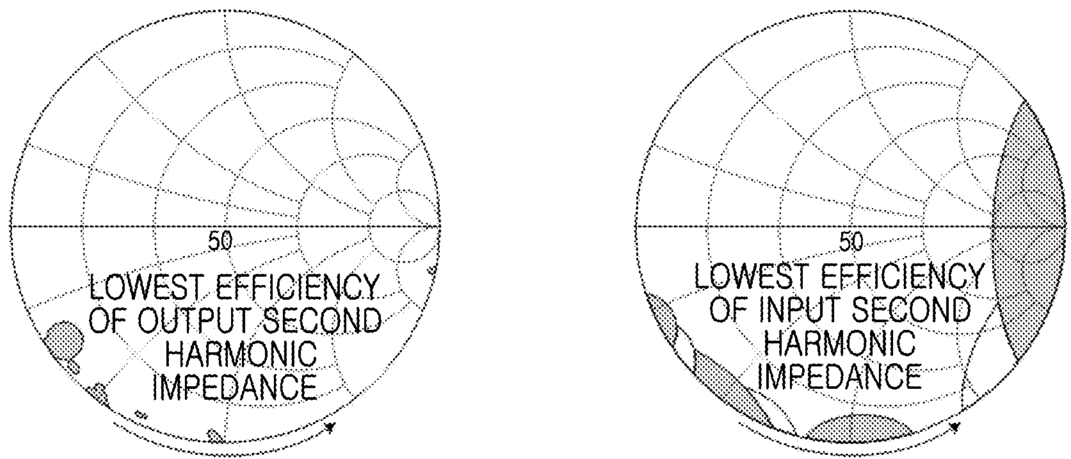

FIGS. 8A and 8B depict source-pull and load-pull results of a second harmonic component efficiency distribution of an input/output stage outside a power amplifier according to an embodiment of the present disclosure.

Referring to FIGS. 8A and 8B, a general power amplifier exhibits the lowest efficiency distribution of the input/output second harmonic impedance throughout Smith chart of FIG. 8A.

By contrast, the power amplifier including the harmonic control circuit exhibits large tolerance throughout Smith chart of FIG. 8B.

The power amplifier performs the matching to acquire the high efficiency for the harmonics using the harmonic control circuit. Thus, the external matching circuit of the power amplifier processes only the fundamental impedance matching, and the power amplifier can achieve the high efficiency merely with the fundamental impedance matching.

Figure 9A:
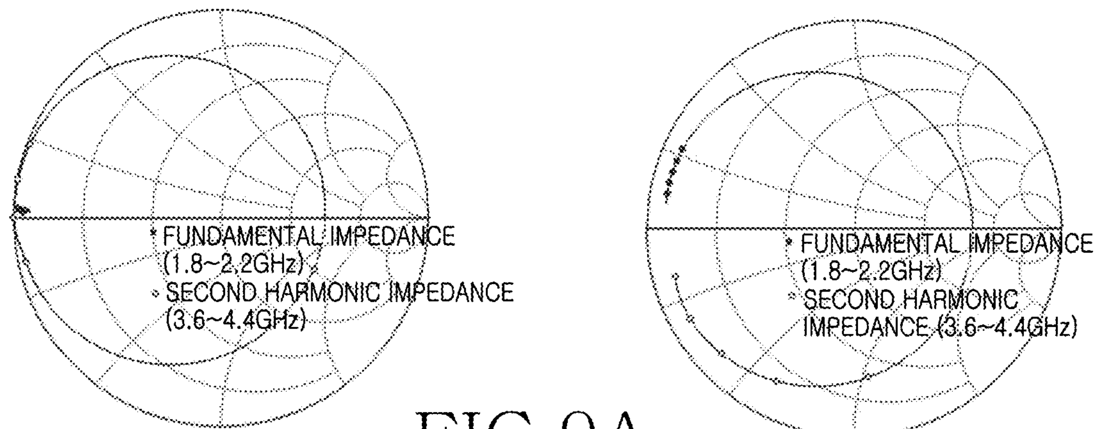
FIGS. 9A and 9B illustrate source-pull and load-pull results of the second harmonic component efficiency distribution of an input/output stage outside a power amplifier according to an embodiment of the present disclosure.
Figure 9B:
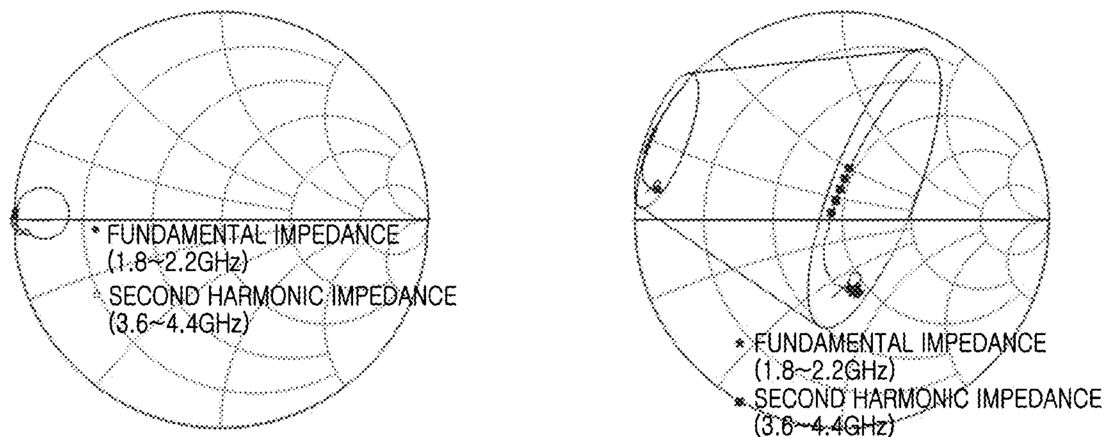

FIGS. 9A and 9B depict source-pull and load-pull results of a second harmonic component efficiency distribution of an input/output stage outside a power amplifier according to an embodiment of the present disclosure.

Referring to FIGS. 9A and 9B, the external matching circuit is implemented based on the results of FIG. 8B. Compared to the results of FIG. 8A, the general power amplifier performs only the fundamental impedance matching, as shown in FIG. 9B. The power amplifier including the harmonic control circuit matches the second harmonic component of the input/output stage to the wideband with the large tolerance, as shown in FIG. 9B.

Figure 10:
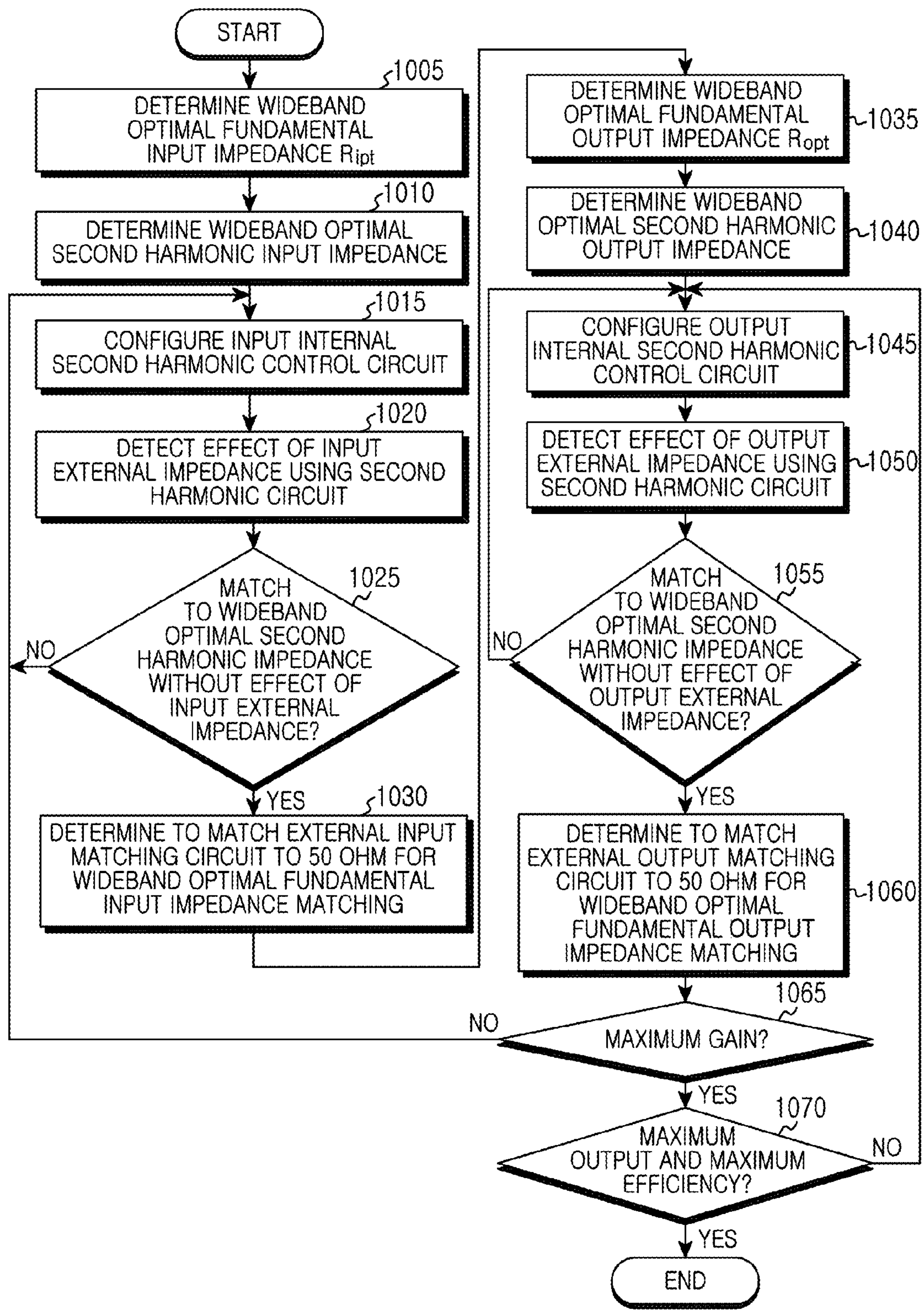
FIG. 10 illustrates operations of a power amplifier according to an embodiment of the present disclosure.

FIG. 10 depicts operations of a power amplifier according to an embodiment of the present disclosure.

Referring to FIG. 10, the power amplifier determines the wideband optimal fundamental input impedance $R_{ipt}$ in operation 1005 and determines the wideband optimal second harmonic input impedance in operation 1010.

Next, the power amplifier configures the input internal second harmonic control circuit in operation 1015 and detects the effect of the input external impedance using the second harmonic circuit in operation 1020.

In operation 1025, the power amplifier determines whether it matches to the wideband optimal second harmonic impedance without the effect of the input external impedance.

When not matching to the wideband optimal second harmonic impedance without the effect of the input external impedance in operation 1025, the power amplifier reconfigures the input internal second harmonic control circuit in operation 1015.

When matching to the wideband optimal second harmonic impedance without the effect of the input external impedance in operation 1025, the power amplifier determines to match the external input matching circuit to 50 ohms for the wideband optimal fundamental input impedance matching in operation 1030.

Next, the power amplifier determines the wideband optimal fundamental output impedance $R_{opt}$ in operation 1035 and determines the wideband optimal second harmonic output impedance in operation 1040.

The power amplifier configures the output internal second harmonic control circuit in operation 1045 and detects the effect of the output external impedance using the second harmonic circuit in operation 1050.

In operation 1055, the power amplifier determines whether it matches to the wideband optimal second harmonic impedance without the effect of the output external impedance.

When not matching to the wideband optimal second harmonic impedance without the effect of the output external impedance in operation 1055, the power amplifier reconfigures the output internal second harmonic control circuit in operation 1045.

When matching to the wideband optimal second harmonic impedance without the effect of the output external impedance in operation 1055, the power amplifier determines to match the external output matching circuit to 50 ohms for the wideband optimal fundamental output impedance matching in operation 1060.

The power amplifier determines whether there is a maximum gain in operation 1065, and if not, the power amplifier reconfigures the input internal second harmonic control circuit in operation 1015.

When the power amplifier determines that the maximum gain is obtained in operation 1065, the power amplifier determines whether the maximum output and the maximum efficiency are not obtained in operation 1070, and if not, the power amplifier reconfigures the output internal second harmonic control circuit in operation 1045.

When the power amplifier determines that the maximum gain is obtained in operation 1065 and proceeds to determine that the maximum output and the maximum efficiency are obtained in operation 1070, the power amplifier finishes this process.

Figure 11:
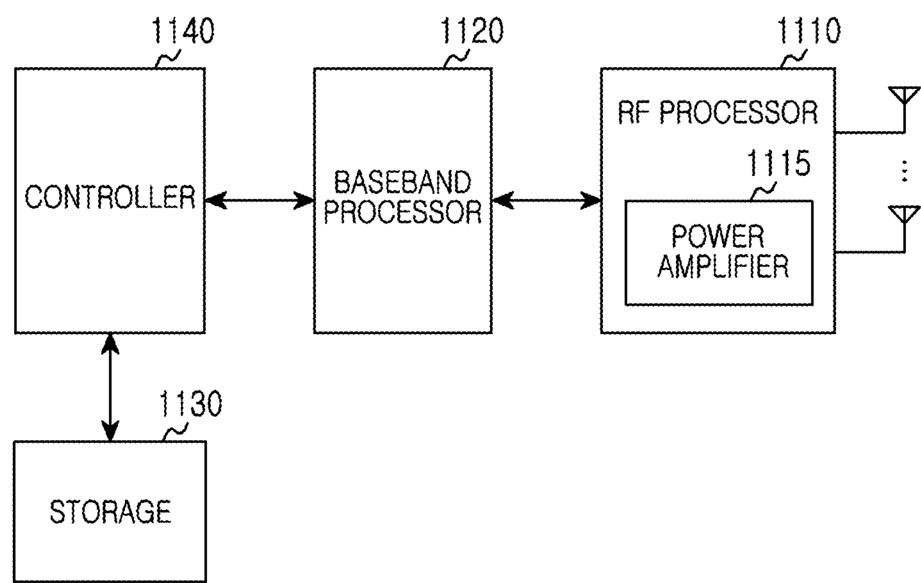
FIG. 11 illustrate a terminal in a wireless communication system according to an embodiment of the present disclosure.

FIG. 11 is a block diagram of a terminal in a wireless communication system according to an embodiment of the present disclosure.

Referring to FIG. 11, the terminal includes a Radio Frequency (RF) processor 1110, a baseband processor 1120, a storage 1130, and a controller 1140.

The RF processor 1110 transmits and/or receives signals over a radio channel through signal band conversion and amplification. That is, the RF processor 1110 up-converts a baseband signal fed from the baseband processor 1120 to an RF signal, transmits the RF signal over the antenna, and down-converts an RF signal received over the antenna to a baseband signal. The RF processor 1110 can include at least one RF chain (not shown) for a plurality of antennas. The RF chain can include a transmit filter, a receive filter, an amplifier, a mixer, an oscillator, a Digital to Analog Converter (DAC) and an Analog to Digital Converter (ADC).

The RF processor 1110 includes a power amplifier 1115 and can enhance the efficiency of the power amplifier 1115 in the wide bandwidth, because it is less affected by the harmonic impedance outside the power amplifier 1115, by using the harmonic control circuit in the power amplifier 1115 with respect to the second harmonics which greatly affect the efficiency of the power amplifier 1115.

The baseband processor 1120 converts the baseband signal and a bit stream according to a physical layer standard of the system. For example, for the data transmission, the baseband processor 1120 generates complex symbols by encoding and modulating the transmit bit stream. For the data reception, the baseband processor 1120 restores the received bit stream by demodulating and decoding the baseband signal fed from the RF processor 1110. For example, in a data transmission based on Orthogonal Frequency Division Multiplexing (OFDM), the baseband processor 1120 generates the complex symbols by encoding and modulating the transmit bit stream, maps the complex symbols to subcarriers, and generates OFDM symbols using Inverse Fast Fourier Transform (IFFT) and Cyclic Prefix (CP) addition. For the data reception, the baseband processor 1120 splits the baseband signal fed from the RF processor 910 into OFDM symbols, restores the signals mapped to the subcarriers using Fast Fourier Transform (FFT), and restores the received bit stream by demodulating and decoding the signals.

As such, the baseband processor 1120 and the RF processor 1110 transmit and/or receive the signals. Hence, the baseband processor 1120 and the RF processor 1110 can be referred to as a transmitter, a receiver, a transceiver, a communication part, or any other similar and/or suitable name for an element that transmits and/or receives signals.

The storage 1130 stores a basic program for operating the terminal, an application program, and data such as setting information.

The controller 1140 controls the operations of the terminal. For example, the controller 1140 sends and receives the signals through the baseband processor 1120 and the RF processor 1110.

The RF processor 1110, the baseband processor 1120, the storage 1130, the controller 1140, and the power amplifier 1115 may be any suitable hardware element, device, and/or unit, such as a processor, an Integrated Circuit (IC), or any other similar and/or suitable type of hardware.

Figure 12:
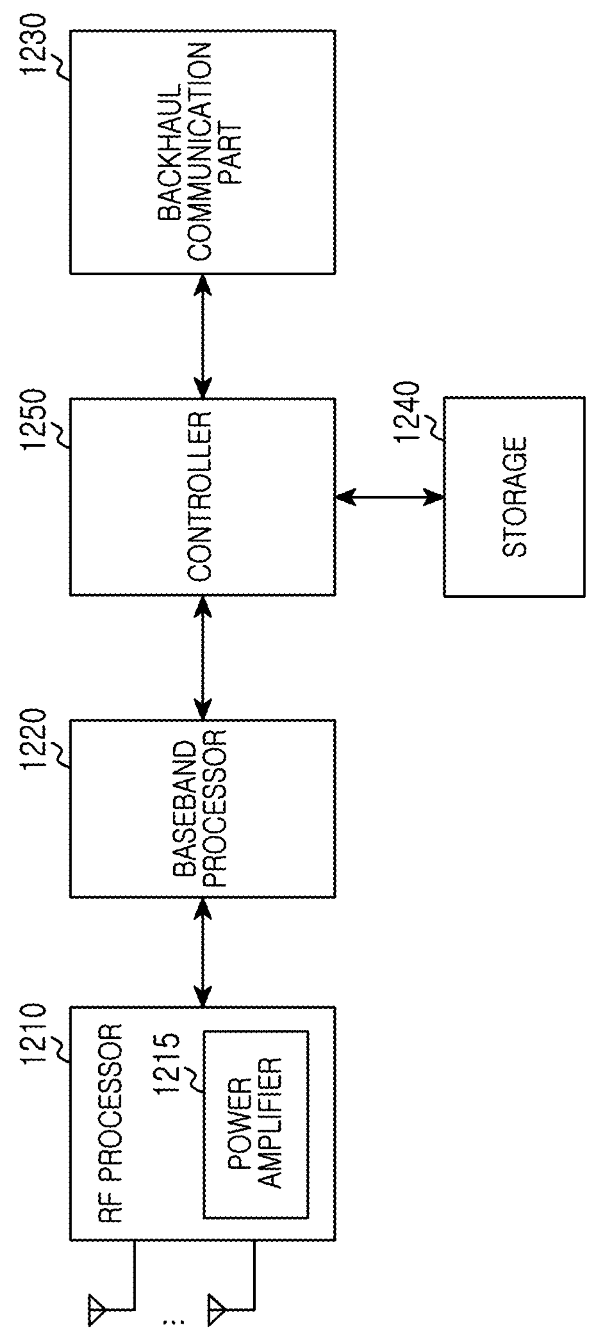
FIG. 12 illustrates a base station in a wireless communication system according to an embodiment of the present disclosure.

FIG. 12 is a block diagram of a base station in the wireless communication system according to an embodiment of the present disclosure.

Referring to FIG. 12, the base station includes an RF processor 1210, a baseband processor 1220, a backhaul communication part 1230, a storage 1240, and a controller 1250.

The RF processor 1210 transmits and/or receives signals over the radio channel through the signal band conversion and amplification. That is, the RF processor 1210 up-converts the baseband signal, fed from the baseband processor 1220, into an RF signal, transmits the RF signal over the antenna, and down-converts the RF signal received over the antenna into the baseband signal. The RF processor 1210 can include at least one RF chain (not shown) for each antenna of a plurality of antennas. The RF chain can include a transmit filter, a receive filter, an amplifier, a mixer, an oscillator, a DAC and an ADC.

The RF processor 1210 includes a power amplifier 1215 and can enhance the efficiency of the power amplifier 1215 in the wide bandwidth because it is less affected by the harmonic impedance outside the power amplifier 1215 by using the harmonic control circuit in the power amplifier 1215 with respect to the second harmonics which greatly affect the efficiency of the power amplifier 1215.

The baseband processor 1220 converts the baseband signal and the bit stream according to the physical layer standard of the system. For example, for the data transmission according to OFDM, the baseband processor 1220 generates complex symbols by encoding and modulating the transmit bit stream, maps the complex symbols to subcarriers, and generates OFDM symbols using the IFFT and the CP addition. For the data reception, the baseband processor 1220 splits the baseband signal fed from the RF processor 1210 into OFDM symbols, restores the signals mapped to the subcarriers using the FFT, and restores the received bit stream by demodulating and decoding the signals.

As such, the baseband processor 1220 and the RF processor 1210 transmit and receive the signals. Hence, the baseband processor 1220 and the RF processor 1210 can be referred to as a transmitter, a receiver, a transceiver, or a communication part.

The backhaul communication part 1230 provides an interface for communicating with other nodes in the network. That is, the backhaul communication part 1230 converts the bit stream, to be sent from the base station to other node, for example, to other base station and/or a core network, into the physical signal and converts the physical signal received from the other node into the bit stream.

The storage 1240 stores a basic program for operating the base station, an application program, and data such as setting information. The storage 1240 provides the stored data according to a request of the controller 1250.

The controller 1250 controls the operations of the base station. For example, the controller 1250 sends and/and receives the signals through the baseband processor 1220 and the RF processor 1210, or the backhaul communication part 1230. The controller 1240 records and reads data to and from the storage 1240.

The RF processor 1210, the baseband processor 1220, the backhaul communication part 1230, the storage 1240, the controller 1250, and the power amplifier 1215 may be any suitable hardware element, device, and/or unit, such as a processor, an Integrated Circuit (IC), or any other similar and/or suitable type of hardware.

The methods described in the claims and/or the specification of the present disclosure can be implemented using hardware and software alone or in combination.

As for the software, a computer-readable storage medium including one or more programs and/or software modules can be provided. One or more programs stored to the non-transitory computer-readable storage medium are configured for execution of one or more processors of the electronic device. One or more programs include instructions making the electronic device execute the methods according to the various embodiments as described in the claims and/or the specification of the present disclosure.

The program, and/or the software module, or in other words, software, can be stored to a Random Access Memory (RAM), a non-volatile memory including a flash memory, a Read Only Memory (ROM), an Electrically Erasable Programmable ROM (EEPROM), a magnetic disc storage device, a Compact Disc (CD)-ROM, Digital Versatile Discs (DVDs) and/or other optical storage devices, and a magnetic cassette. Alternatively, the program can be stored to a memory combining part or all of those recording media. A plurality of memories may be equipped.

The program can be stored to an attachable storage device of the electronic device accessible via the communication network such as Internet, Intranet, Local Area Network (LAN), Wide LAN (WLAN), or Storage Area Network (SAN), or a communication network combining the networks. The storage device can access the electronic device through an external port. A separate storage device in the communication network can access the portable electronic device.

The present disclosure can provide the efficient wideband power amplifier not affected by the external impedance with respect to the harmonics by adding the internal harmonic matching circuit.

Also, the present disclosure can enhance the efficiency of the power amplifier, which consumes considerable power, by fulfilling the fundamental impedance matching and the harmonic impedance matching at the same time.

The harmonics, particularly the second harmonics, greatly affecting the efficiency of the power amplifier is less affected by the external harmonic impedance using the internal harmonic control circuit. Therefore, the present disclosure can enhance the efficiency of the power amplifier in the wide bandwidth.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An apparatus of a power amplifier, the apparatus comprising:

an input boosting circuit including a first harmonic control circuit that is used for matching a harmonic input signal;

a die cell configured to receive and amplify an output signal from the input boosting circuit; and an output boosting circuit including a second harmonic control circuit that is used for matching a harmonic output signal of the output signal from the die cell.

2. The apparatus of claim 1, wherein the first harmonic control circuit matches the harmonic input signal to a short region.

3. The apparatus of claim 1, wherein the first harmonic control circuit comprises at least one inductor and at least one capacitor.

4. The apparatus of claim 3, wherein the first harmonic control circuit comprises one inductor and one capacitor connected in series, wherein the one inductor is connected to the input boosting circuit, and wherein the one capacitor is connected to a ground.

5. The apparatus of claim 3, wherein the first harmonic control circuit comprises two inductors connected in series and two capacitors, wherein a first inductor of the two inductors is connected to a first point of the input boosting circuit, wherein a second inductor of the two inductors is connected to a second point of the input boosting circuit, wherein a first capacitor of the two capacitors connects a point between the first inductor and the second inductor with a ground, and wherein a second capacitor of the two capacitors connects the second point of the input boosting circuit with the ground.

6. The apparatus of claim 2, wherein the first harmonic control circuit is connected to one of a first stage, a mid stage, and a last stage of the input boosting circuit.

7. The apparatus of claim 1, wherein the second harmonic control circuit matches the harmonic output signal of the output signal from the die cell to an inductive region.

8. The apparatus of claim 1, wherein the second harmonic control circuit comprises at least one inductor and at least one capacitor.

9. The apparatus of claim 8, wherein the second harmonic control circuit comprises one inductor and one capacitor connected in series, wherein the inductor is connected to the output boosting circuit, and wherein the capacitor is connected to a ground.

10. The apparatus of claim 8, wherein the second harmonic control circuit comprises two inductors connected in series and two capacitors, wherein a first inductor of the two inductors is connected to a first point of the output boosting circuit, wherein a second inductor of the two inductors is connected to a second point of the output boosting circuit, wherein a first capacitor of the two capacitors connects a point between the first inductor and the second inductor with a ground, and wherein a second capacitor of the two capacitors connects the second point of the output boosting circuit with the ground.

11. The apparatus of claim 7, wherein the second harmonic control circuit is connected to one of a first stage, a mid stage, and a last stage of the input boosting circuit.

12. A method for operating a power amplifier, the method comprising:

matching, at an input boosting circuit including a first harmonic control circuit, a harmonic input signal using the first harmonic control circuit;

receiving and amplifying, at a die cell, an output signal of the input boosting circuit; and matching, at an output boosting circuit including a second harmonic control circuit, a harmonic output signal of the output signal from the die cell using the second harmonic control circuit.

13. The method of claim 12, wherein the first harmonic control circuit matches the harmonic input signal to a short region.

14. The method of claim 12, wherein the first harmonic control circuit comprises at least one inductor and at least one capacitor.

15. The method of claim 14, wherein the first harmonic control circuit comprises one inductor and one capacitor connected in series, wherein the one inductor is connected to the input boosting circuit, and wherein the capacitor is connected to a ground.

16. The method of claim 14, wherein the first harmonic control circuit comprises two inductors connected in series and two capacitors, wherein a first inductor of the two inductors is connected to a first point of the input boosting circuit, wherein a second inductor of the two inductors is connected to a second point of the input boosting circuit, wherein a first capacitor of the two capacitors connects a point between the first inductor and the second inductor with a ground, and wherein a second capacitor of the two capacitors connects the second point of the input boosting circuit with the ground.

17. The method of claim 12, wherein the output boosting circuit matches the harmonic output signal of the output signal from the die cell to an inductive region using the second harmonic control circuit.

18. The method of claim 12, wherein the second harmonic control circuit comprises at least one inductor and at least one capacitor.

19. The method of claim 18, wherein the second harmonic control circuit comprises one inductor and one capacitor connected in series, wherein the inductor is connected to the output boosting circuit, and wherein the capacitor is connected to a ground.

20. The method of claim 18, wherein the second harmonic control circuit comprises two inductors connected in series and two capacitors, wherein a first inductor of the two inductors is connected to a first point of the output boosting circuit, wherein a second inductor of the two inductors is connected to a second point of the output boosting circuit, wherein a first capacitor of the two capacitors connects a point between the first inductor and the second inductor with a ground, and wherein a second capacitor of the two capacitors connects the second point of the input boosting circuit with the ground.

* * * * *